United States Patent
Chung et al.

(10) Patent No.: US 8,672,517 B2
(45) Date of Patent: Mar. 18, 2014

(54) LIGHT-EMITTING MODULE

(75) Inventors: Chia-Tin Chung, Miaoli County (TW); Shen-Ta Yang, Taipei (TW)

(73) Assignee: Paragon Semiconductor Lighting Technology Co., Ltd., New Taipei (TW)

( * ) Notice: Subject to any disclaimer, the term of this patent is extended or adjusted under 35 U.S.C. 154(b) by 134 days.

(21) Appl. No.: 13/452,752

(22) Filed: Apr. 20, 2012

(65) Prior Publication Data
US 2012/0268929 A1    Oct. 25, 2012

(30) Foreign Application Priority Data

Apr. 22, 2011 (TW) .............................. 100207227 U

(51) Int. Cl.
*F21V 29/00* (2006.01)
*H01L 23/34* (2006.01)

(52) U.S. Cl.
USPC . 362/294; 362/235; 362/311.02; 362/311.04; 257/98; 257/100; 257/712

(58) Field of Classification Search
USPC .......... 362/294, 235, 311.02, 311.04; 257/98, 257/100, 712
See application file for complete search history.

(56) References Cited

U.S. PATENT DOCUMENTS

| 5,785,418 | A * | 7/1998 | Hochstein | 362/373 |
|---|---|---|---|---|
| 8,172,434 | B1 * | 5/2012 | Olsson | 362/346 |
| 8,217,404 | B2 * | 7/2012 | Wu et al. | 257/88 |
| 8,240,885 | B2 * | 8/2012 | Miller | 362/294 |
| 8,324,789 | B2 * | 12/2012 | Hisayasu et al. | 313/46 |
| 8,405,118 | B2 * | 3/2013 | Chung et al. | 257/99 |
| 8,421,373 | B2 * | 4/2013 | Chung et al. | 315/294 |
| 2007/0170454 | A1 * | 7/2007 | Andrews | 257/100 |
| 2008/0157112 | A1 * | 7/2008 | He et al. | 257/98 |
| 2009/0316398 | A1 * | 12/2009 | Chang | 362/235 |

* cited by examiner

*Primary Examiner* — Ali Alavi
(74) *Attorney, Agent, or Firm* — Li & Cai Intellectual Property (USA) Office

(57) ABSTRACT

A light-emitting module includes a heat-dissipating structure, a multichip package structure and a protection cover structure. The multichip package structure is disposed on the heat-dissipating structure, and the multichip package structure includes a substrate unit, a light-emitting unit, a frame unit and a package unit. The protection cover structure is disposed on the heat-dissipating structure to cover and protect the multichip package structure, and the protection cover structure has an opening for exposing the package unit.

16 Claims, 10 Drawing Sheets

LIGHT-EMITTING MODULE

BACKGROUND OF THE INVENTION

1. Field of the Invention

The instant disclosure relates to a light-emitting module, and more particularly, to a light-emitting module having a protection function.

2. Description of Related Art

The invention of the lamp greatly changed the style of building construction and the living style of human beings, allowing people to work during the night. Traditional lighting devices such as lamps that adopt incandescent bulbs, fluorescent bulbs, or power-saving bulbs have been generally well-developed and used intensively indoor illumination. However, compared to the newly developed light-emitting-diode (LED) lamps, these traditional lamps have the disadvantages of quick attenuation, high power consumption, high heat generation, short working life, high fragility, and being not recyclable. Thus, various LED package structures are created to replace the traditional lighting devices.

SUMMARY OF THE INVENTION

One aspect of the instant disclosure relates to a light-emitting module having a protection function.

One of the embodiments of the instant disclosure provides a light-emitting module, comprising: a heat-dissipating structure, a multichip package structure and a protection cover structure. The multichip package structure is disposed on the heat-dissipating structure, wherein the multichip package structure comprises: a substrate unit, a light-emitting unit, a frame unit and a package unit. The substrate unit includes a substrate body and a chip-placing region formed on the top surface of the substrate body. The light-emitting unit includes a plurality of LED bare chips disposed on the chip-placing region and electrically connected to the substrate body. The frame unit includes a surrounding light-reflecting colloid body surroundingly coated on the top surface of the substrate body, wherein the surrounding light-reflecting colloid body surrounds the LED bare chips to form a colloid position limiting space on the chip-placing region. The package unit includes a light-transmitting colloid body disposed on the top surface of the substrate body and in the colloid position limiting space to cover the LED bare chips. The protection cover structure is disposed on the heat-dissipating structure to cover and protect the multichip package structure, wherein the protection cover structure has an opening for exposing the package unit.

Another one of the embodiments of the instant disclosure provides a light-emitting module, comprising: a heat-dissipating structure, a multichip package structure and a protection cover structure. The multichip package structure is disposed on the heat-dissipating structure, wherein the multichip package structure comprises: a substrate unit, a light-emitting unit, a frame unit and a package unit. The substrate unit includes a substrate body, a first chip-placing region formed on the top surface of the substrate body, and a second chip-placing region formed on the top surface of the substrate body. The light-emitting unit includes at least one first light-emitting module and at least one second light-emitting module, wherein the at least one first light-emitting module includes a plurality of first LED bare chips disposed on the first chip-placing region and electrically connected to the substrate body, and the at least one second light-emitting module includes a plurality of second LED bare chips disposed on the second chip-placing region and electrically connected to the substrate body. The frame unit includes at least one first surrounding light-reflecting colloid body and at least one second surrounding light-reflecting colloid body surroundingly coated on the top surface of the substrate body, wherein the at least one first surrounding light-reflecting colloid body surrounds the at least one first light-emitting module to form at least one first colloid position limiting space on the first chip-placing region, and the at least one second surrounding light-reflecting colloid body surrounds the at least one second light-emitting module and the at least one first surrounding light-reflecting colloid body to form at least one second colloid position limiting space on the second chip-placing region and between the at least one first surrounding light-reflecting colloid body and the at least one second surrounding light-reflecting colloid body. The package unit includes a first light-transmitting colloid body and a second light-transmitting colloid body disposed on the top surface of the substrate body to respectively cover the at least one first light-emitting module and the at least one second light-emitting module, wherein the first light-transmitting colloid body and the second light-transmitting colloid body are respectively disposed in the at least one first colloid position limiting space and the at least one second colloid position limiting space. The protection cover structure is disposed on the heat-dissipating structure to cover and protect the multichip package structure, wherein the protection cover structure has an opening for exposing the package unit.

Therefore, because the protection cover structure having the opening is disposed on the heat-dissipating structure to cover and protect the multichip package structure, the light-emitting module is capable of the protection function.

To further understand the techniques, means and effects of the instant disclosure applied for achieving the prescribed objectives, the following detailed descriptions and appended drawings are hereby referred, such that, through which, the purposes, features and aspects of the instant disclosure can be thoroughly and concretely appreciated. However, the appended drawings are provided solely for reference and illustration, without any intention to limit the instant disclosure.

DETAILED DESCRIPTION OF THE PREFERRED EMBODIMENTS

[First Embodiment]

Referring to FIG. 1A to FIG. 1D, where the first embodiment of the instant disclosure provides a light-emitting module, comprising: a heat-dissipating structure H, a multichip package structure M, a protection cover structure P, a lens structure L and a securing structure F.

Figure 1A:
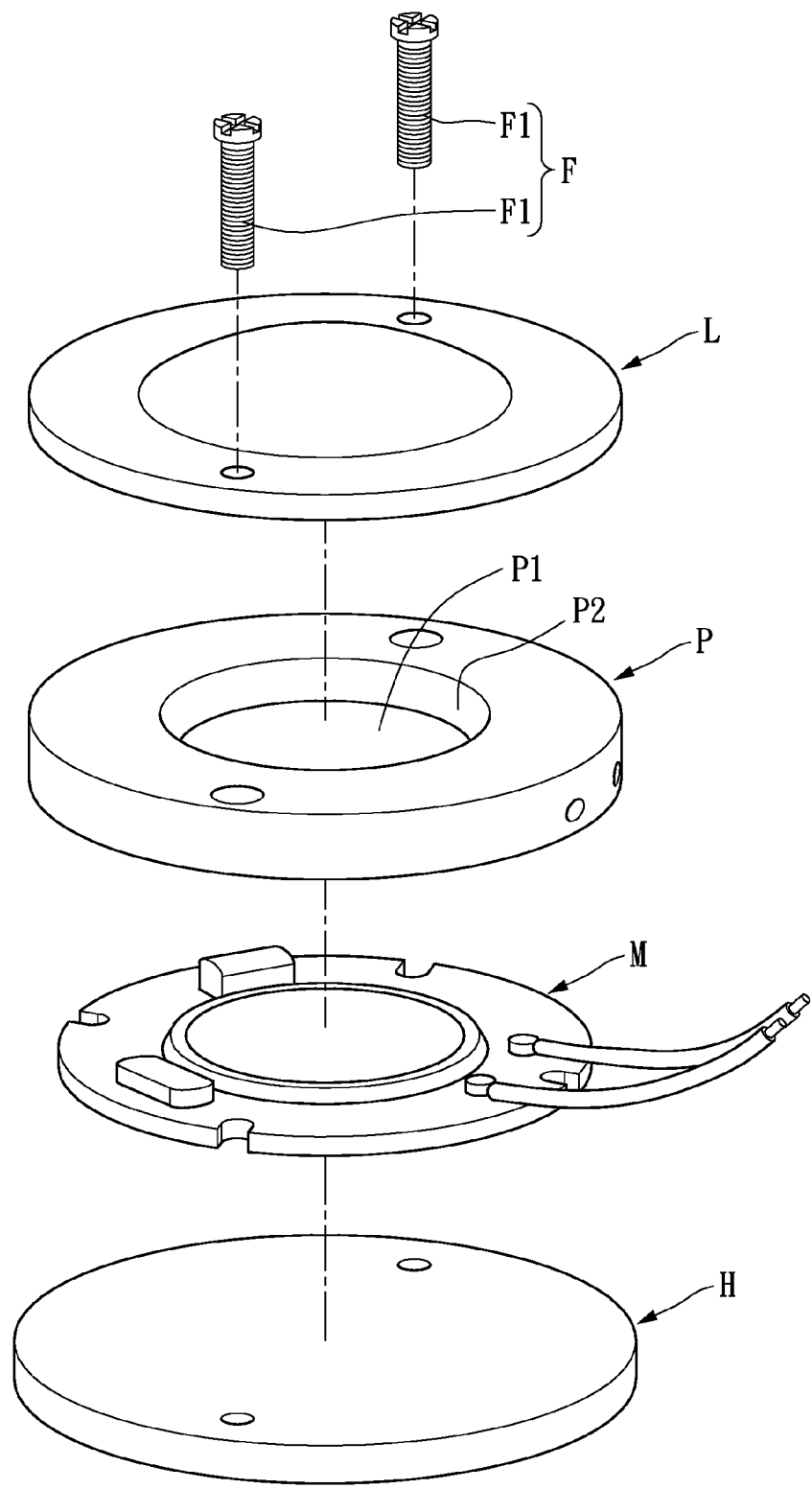
FIG. 1A shows a perspective, exploded, schematic view of the light-emitting module according to the first embodiment of the instant disclosure.
Figure 1B:
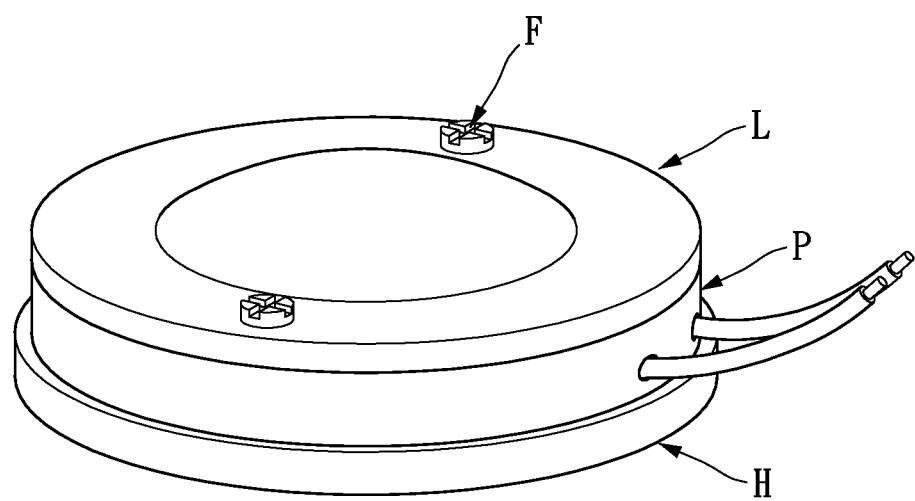
FIG. 1B shows a perspective, assembled, schematic view of the light-emitting module according to the first embodiment of the instant disclosure.

Referring to FIG. 1A and FIG. 1B, the multichip package structure M is disposed on the heat-dissipating structure H. The protection cover structure P is disposed on the heat-dissipating structure H to cover and protect the multichip package structure M, and the protection cover structure P has an opening P1 for exposing one part of the multichip package structure M. In addition, the protection cover structure P has a surrounding inclined surface P2 formed in opening P1, and the lens structure L is disposed on the protection cover structure P to cover the opening P1 of the protection cover structure P. Moreover, the securing structure F includes a plurality of securing elements F1, where each securing element F1 sequentially passes through the lens structure L, the protection cover structure P and one part of the heat-dissipating structure H to fix the multichip package structure M between the protection cover structure P and the heat-dissipating structure H.

Figure 1C:
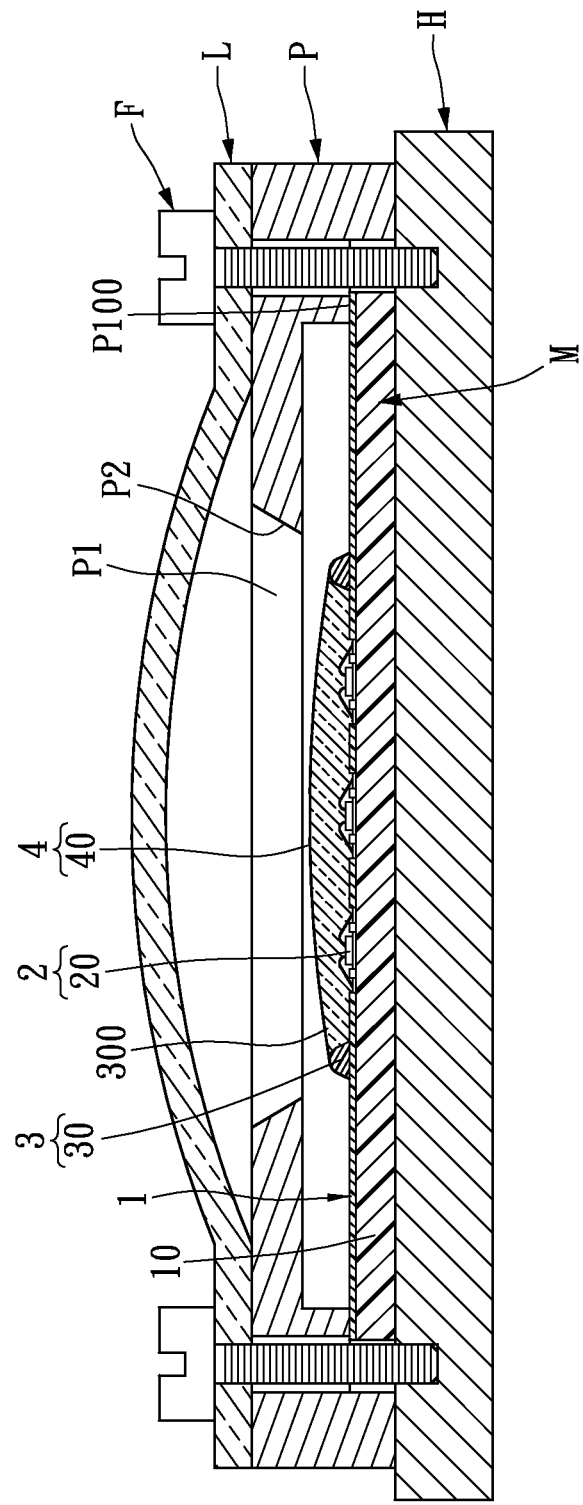
FIG. 1C shows a lateral, cross-sectional, schematic view of the light-emitting module according to the first embodiment of the instant disclosure.
Figure 1D:
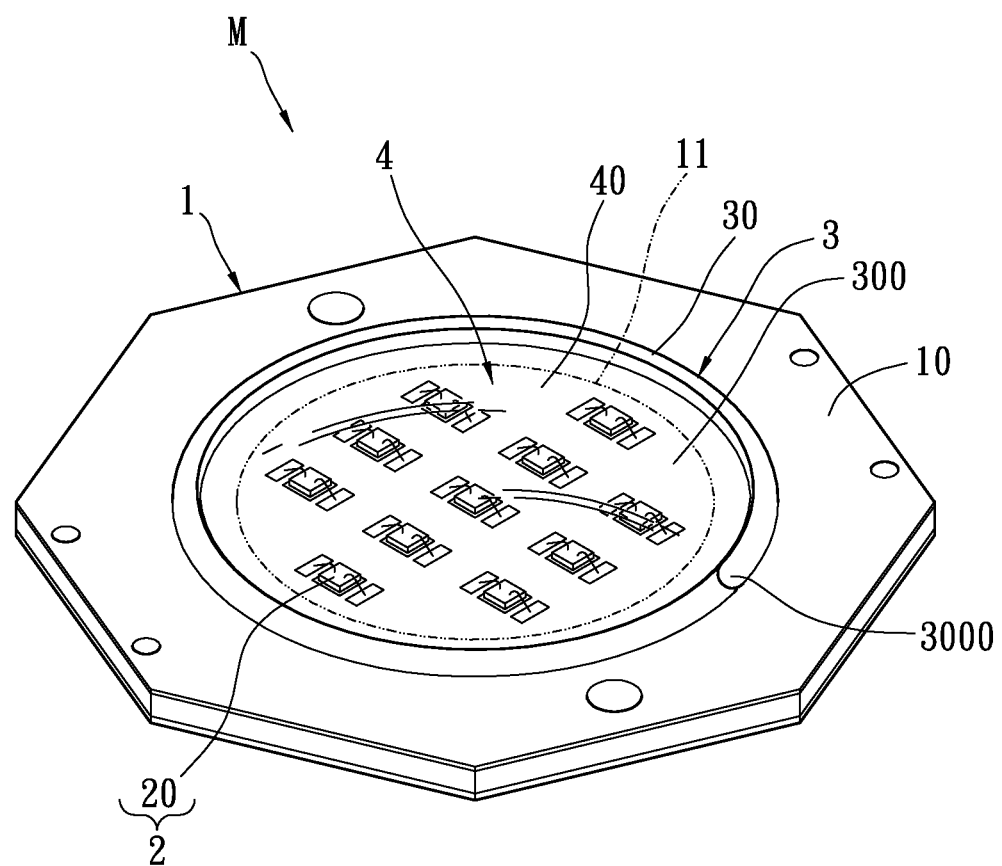
FIG. 1D shows a perspective, schematic view of the multichip package structure according to the first embodiment of the instant disclosure.

For example, referring to FIG. 1C and FIG. 1D, the multichip package structure M comprises: a substrate unit 1, a light-emitting unit 2, a frame unit 3 and a package unit 4. The substrate unit 1 includes a substrate body 10 and a chip-placing region 11 formed on the top surface of the substrate body 10, and the substrate body 10 has a circle (as shown in FIG. 1A) or a polygon (as shown in FIG. 1D). The light-emitting unit 2 includes a plurality of LED bare chips 20 disposed on the chip-placing region 11 and electrically connected to the substrate body 10 by wire bonding. The frame unit 3 includes a surrounding light-reflecting colloid body 30 surroundingly coated on the top surface of the substrate body 10, and the first surrounding light-reflecting colloid body 30a can surround the LED bare chips 20 to form a colloid position limiting space 300 on the chip-placing region 11. The package unit 4 includes a light-transmitting colloid body 40 disposed on the top surface of the substrate body 10 and in the colloid position limiting space 300 to cover the LED bare chips 20.

Furthermore, the first surrounding light-reflecting colloid body 30a has a convex or concave junction portion 3000 formed on the top surface thereof In other words, when the first surrounding light-reflecting colloid body 30a is going to finish by surroundingly coating, the convex or concave junction portion 3000 is formed naturally on the first surrounding light-reflecting colloid body 30a. In addition, the opening P1 of the protection cover structure P can be used to expose the package unit 4 of the multichip package structure M, and the protection cover structure P has a bottom side contacting or pressing the substrate unit 1 of the multichip package structure M. When each securing element F1 sequentially passes through the lens structure L, the protection cover structure P and one part of the heat-dissipating structure H, the multichip package structure M can be fixed between the protection cover structure P and the heat-dissipating structure H, thus each securing element F1 does not need to pass through the multichip package structure M for preventing the multichip package structure M from being damaged by the securing element F1.

[Second Embodiment]

Referring to FIG. 2A to FIG. 2D, the second embodiment of the instant disclosure provides a light-emitting module. The difference between the second embodiment and the first embodiment is as follows: in the second embodiment, the multichip package structure M includes a substrate unit 1, a light-emitting unit, a frame unit 3 and a package unit 4.

The substrate unit 1 includes a substrate body 10, a first chip-placing region 11 formed on the top surface of the substrate body 10, and a second chip-placing region 11 formed on the top surface of the substrate body 10. For example, the substrate body 10 includes a circuit substrate 100, a heat dissipating layer 101 disposed on the bottom surface of the circuit substrate 100, a plurality of conductive pads 102 disposed on the top surface of the circuit substrate 100, and an insulative layer 103 disposed on the top surface of the circuit substrate 100 to expose the conductive pads 102. Hence, the heat dissipating efficiency of the circuit substrate 100 can be increased by using the heat dissipating layer 101, and the insulative layer 103 may be a solder mask for only exposing the conductive pads 102 in order to achieve local soldering.

The light-emitting unit includes at least one first light-emitting module 2a (such as for generating red light) and at least one second light-emitting module 2b (such as for generating blue light). The first light-emitting module 2a includes a plurality of first LED bare chips (such as red LED bare chips 20a) disposed on the first chip-placing region 11 and electrically connected to the substrate unit 1, and the second light-emitting module 2b includes a plurality of second LED bare chips (such as blue LED bare chips 20b) disposed on the second chip-placing region and electrically connected to the substrate unit 1. In other words, a designer can plan at least two predetermined chip-placing regions 11 on the substrate body 10 in advance, thus the red LED bare chips 20a and the blue LED bare chips 20b can be respectively placed on the two chip-placing regions 11 by wire bonding.

The frame unit 3 includes at least one first surrounding light-reflecting colloid body 30 (such as an annular resin frame) and at least one second surrounding light-reflecting colloid body 30b surroundingly formed on the top surface of the substrate body 10 by coating or other forming method. The first surrounding light-reflecting colloid body 30a surrounds the first light-emitting module 2a to form at least one first colloid position limiting space 300a on the first chip-placing region 11, and the second surrounding light-reflecting colloid body 30b surrounds the second light-emitting module 2b and the first surrounding light-reflecting colloid body 30a to form at least one second colloid position limiting space 300b on the second chip-placing region 11 and between the first surrounding light-reflecting colloid body 30a and the second surrounding light-reflecting colloid body 30b.

The first surrounding light-reflecting colloid body 30a has a convex or concave junction portion 3000, and the second surrounding light-reflecting colloid body 30b has a convex or concave junction portion 3000. In other words, when the first surrounding light-reflecting colloid body 30a or the second surrounding light-reflecting colloid body 30b is going to finish by surroundingly coating, the convex or concave junction portion 3000 is formed naturally on the first surrounding light-reflecting colloid body 30a or the second surrounding light-reflecting colloid body 30b. In addition, the first or second surrounding light-reflecting colloid body (30a or 30b) has an arc shape formed on the top surface thereof, the first or second surrounding light-reflecting colloid body (30a or 30b) has a radius tangent T and the angle θ of the radius tangent T relative to the top surface of the substrate body 10 may be between 40° and 50°, the maximum height A of the first or second surrounding light-reflecting colloid body (30a or 30b) relative to the top surface of the substrate body 10 may be between 0.3 mm and 0.7 mm, the width W of the bottom side of the first or second surrounding light-reflecting colloid body (30a or 30b) may be between 1.5 mm and 3 mm, the thixotropic index of the first or second surrounding light-reflecting colloid body (30a or 30b) may be between 4 and 6, and the first or second surrounding light-reflecting colloid body (30a or 30b) may be formed by mixing inorganic additive with white thermohardening colloid.

Figure 2A:
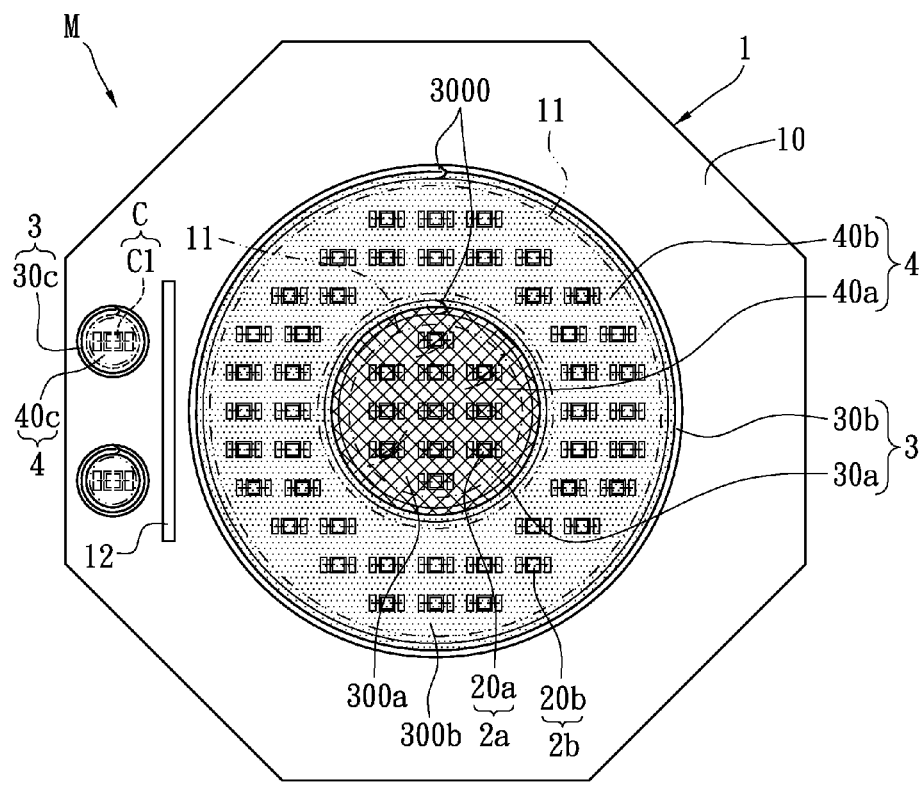
FIG. 2A shows a top, schematic view of the multichip package structure according to the second embodiment of the instant disclosure.
Figure 2B:
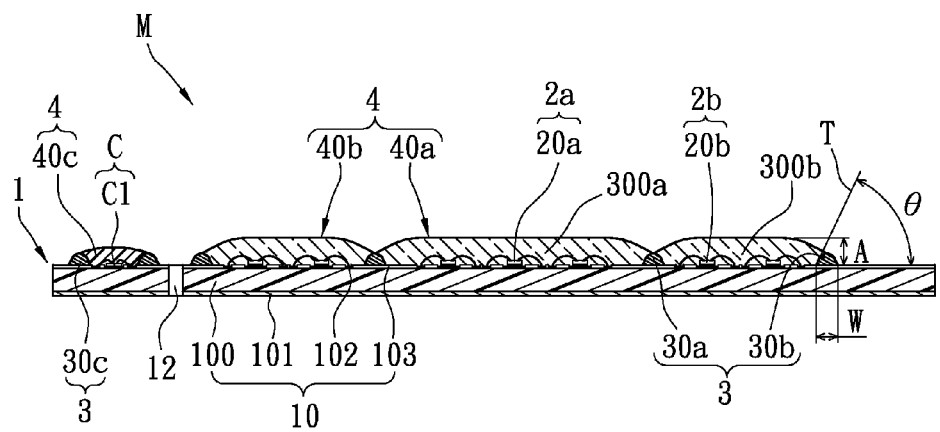
FIG. 2B shows a lateral, cross-sectional, schematic view of the multichip package structure according to the second embodiment of the instant disclosure.

The package unit 4 includes a first light-transmitting colloid body (such as a transparent colloid body 40a) and a second light-transmitting colloid body (such as a phosphor colloid body 40b) disposed on the top surface of the substrate body 10 to respectively cover the first light-emitting module 2a and the second light-emitting module 2b. The transparent colloid body 40a is limited and disposed in the first colloid position limiting space 300a, and the phosphor colloid body 40b is limited and disposed in the second colloid position limiting space 300b. In addition, the first surrounding light-reflecting colloid body 30a and the second surrounding light-reflecting colloid body 30b can be arranged to form a concentric circular shape (arranged as concentric circles). The second light-emitting module 2b is disposed between the first surrounding light-reflecting colloid body 30a and the second surrounding light-reflecting colloid body 30b, and the blue LED bare chips 20b are disposed around the first surrounding light-reflecting colloid body 30a (as shown in FIG. 2A).

Furthermore, when the red light source generated by matching the red LED bare chips 20a and the transparent colloid body 40a and the white light source generated by matching the blue LED bare chips 20b and the phosphor colloid body 40b are mixed with each other, the color render index (such as the rendering average (Ra) and the deep red $R_9$) of the multichip package structure M can be increased.

The multichip package structure M further comprises a current-limiting unit C including at least two current-limiting chips C2 disposed on and electrically connected to the top surface of the substrate body 10 (such as by wire bonding) and separated from the second surrounding light-reflecting colloid body 30b by a predetermined distance. The frame unit 3 includes at least two third surrounding light-reflecting colloid bodies 30c surroundingly formed on the top surface of the substrate body 10 by coating to respectively surround the two current-limiting chips C1. The method of making the two third surrounding light-reflecting colloid bodies 30c is the same as that of making the first or second surrounding light-reflecting colloid body (30a, 30b). Of course, the two third surrounding light-reflecting colloid bodies 30c can be combined to form single third surrounding light-reflecting colloid body 30c for surrounding the two current-limiting chips C1 at the same time. In addition, the package unit 4 includes at least two opaque colloid bodies 40c disposed on the top surface of the substrate body 10 to respectively cover the two current-limiting chips C1 and be respectively surrounded by the two third surrounding light-reflecting colloid bodies 30c, thus the two opaque colloid bodies 40c can prevent the two current-limiting chips C1 from being damaged or affected by lighting of the red LED bare chips 20a and the blue LED bare chips 20b.

Furthermore, the substrate unit 1 includes at least one heat-insulating slot 12 passing through the substrate body 10, and the heat-insulating slot 12 can be formed between the light-emitting unit (the first light-emitting module 2a and the second light-emitting module 2b) and the current-limiting unit C or between the second surrounding light-reflecting colloid body 30b and the third surrounding light-reflecting colloid body 30c. Therefore, the heat transmitting path between the light-emitting unit and the current-limiting unit C can be effectively reduced by using the heat-insulating slot 12, thus the velocity of transmitting the heat generated by the current-limiting chip C1 to the light-emitting unit can be effectively decreased.

Figure 2C:
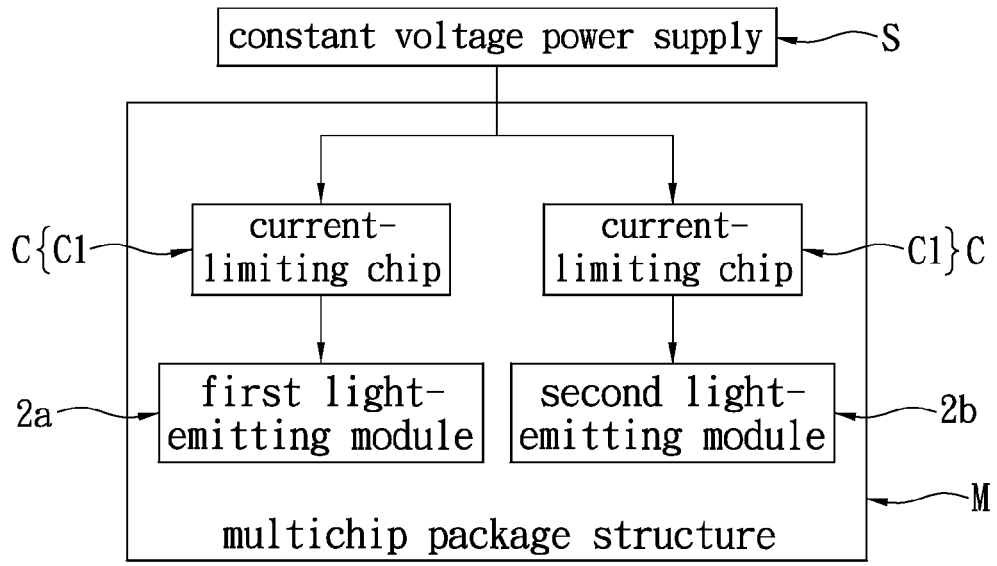
FIG. 2C shows a function block of the multichip package structure according to the second embodiment of the instant disclosure.
Figure 2D:
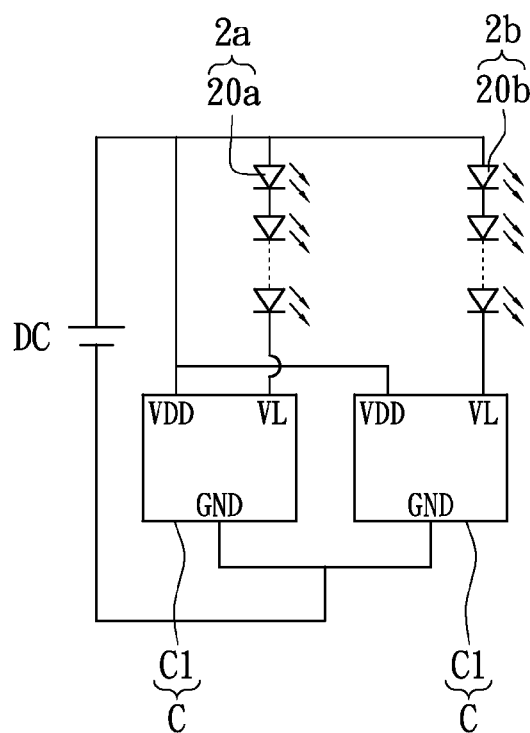
FIG. 2D shows a circuit, schematic view of the multichip package structure according to the second embodiment of the instant disclosure.

Referring to FIGS. 2C and 2D, the first light-emitting module 2a and the second light-emitting module 2b may be electrically connected to the substrate body 10 in parallel. The red LED bare chips 20a and one of the two current-limiting chips C1 may be electrically connected with each other in series, and the blue LED bare chips 20b and the other current-limiting chip C1 may be electrically connected with each other in series. In addition, the current-limiting chip C1 is electrically connected between the constant voltage power supply S and the first light-emitting module 2a and between the constant voltage power supply S and the second light-emitting module 2b, thus the light-emitting unit can obtain constant voltage from the constant voltage power supply S through the current-limiting chip C1.

Of course, the red LED bare chips 20a can be electrically connected with each other in parallel to form a parallel red LED bare chip group, the blue LED bare chips 20b can be divided into a plurality of parallel blue LED bare chip groups, and the parallel red LED bare chip group and the parallel blue LED bare chip groups can be electrically connected with each other in series. In addition, the red LED bare chips 20a can be lighted up simultaneously or sectionally, and the blue LED bare chips 20b can be lighted up simultaneously or sectionally.

[Third Embodiment]

Figure 3A:
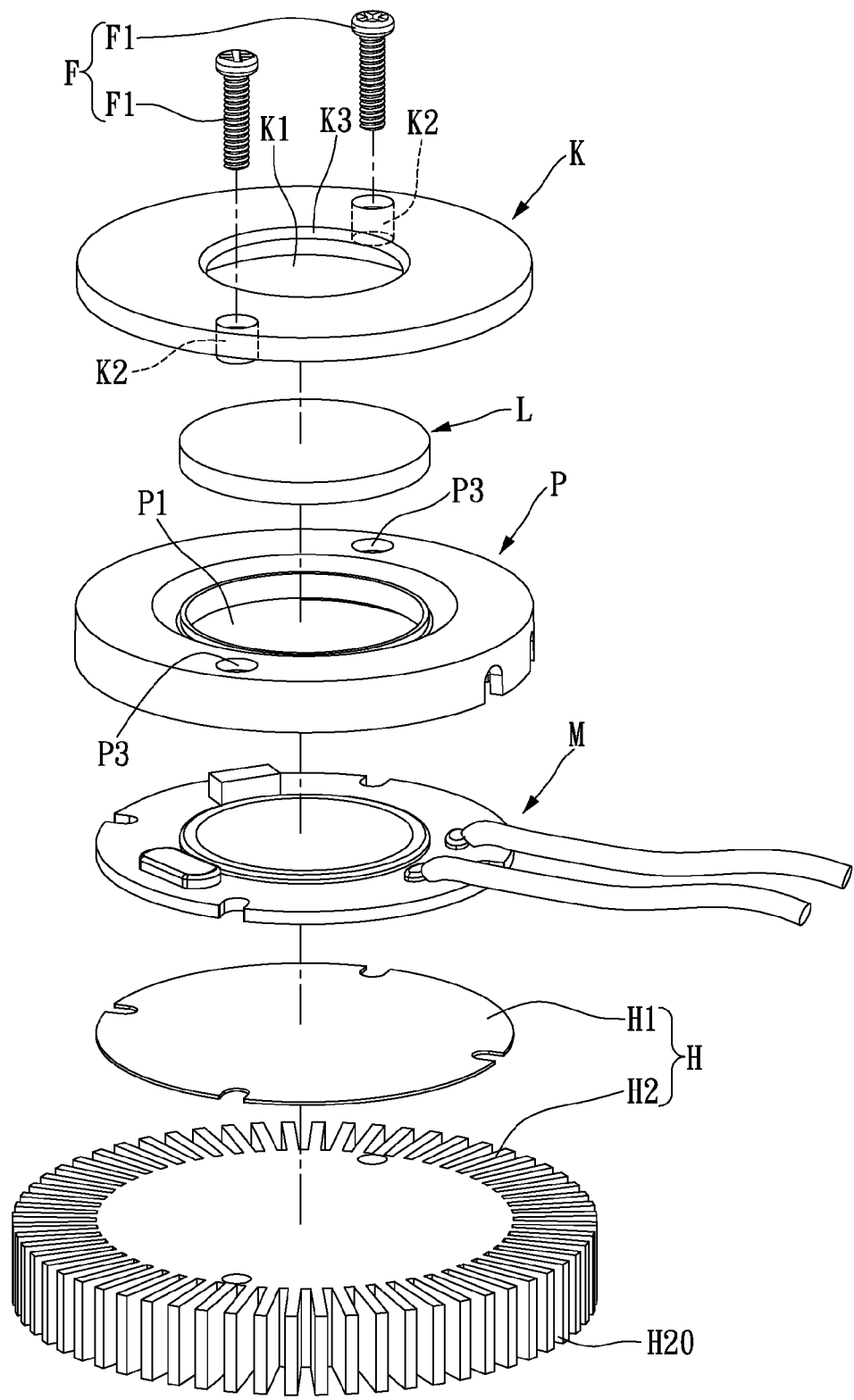
FIG. 3A shows a perspective, exploded, schematic view of the light-emitting module according to the third embodiment of the instant disclosure.
Figure 3B:
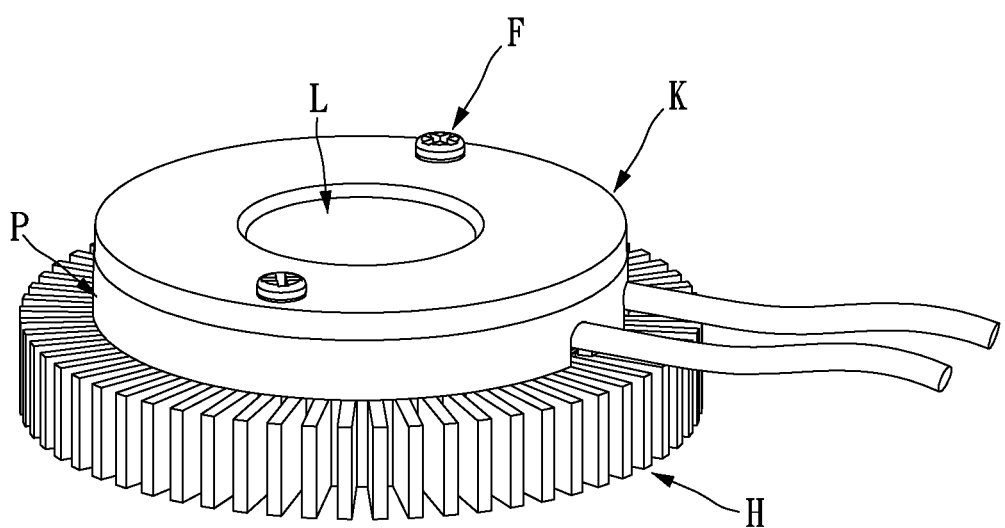
FIG. 3B shows a perspective, assembled, schematic view of the light-emitting module according to the third embodiment of the instant disclosure.

Referring to FIG. 3A and FIG. 3B, where the third embodiment of the instant disclosure provides a light-emitting module, comprising: a heat-dissipating structure H, a multichip package structure M, a protection cover structure P, a lens structure L, a positioning structure K and a securing structure F.

Referring to FIG. 3A and FIG. 3B, the multichip package structure M is disposed on a first heat-dissipating element H1 (such as graphite sheet) of the heat-dissipating structure H. The protection cover structure P is disposed on a second heat-dissipating element H2 (such as a heat-dissipating block having fins H 20 disposed around the peripheral thereof) of the heat-dissipating structure H to cover and protect the multichip package structure M, and the protection cover structure P has an opening P1 for exposing one part of the multichip package structure M and two positioning holes P3. In addition, the lens structure L is disposed on the protection cover structure P to cover the opening P1 of the protection cover structure P. Moreover, the positioning structure K is disposed on the protection cover structure P to firmly fix the lens structure L on the protection cover structure P, and the positioning structure K has a through hole K1 corresponding to the opening P1, two positioning posts K2 respectively inserted into the two positioning holes P3, and a surrounding inclined surface K3 formed in the through hole K1. Moreover, the securing structure F includes a plurality of securing elements F1, where each securing element F1 sequentially passes through the positioning post K2 of the positioning structure K, the positioning hole P3 of the protection cover structure P, and the first heat-dissipating element H1 and the second heat-dissipating element H2 of the heat-dissipating structure H to fix the lens structure L between the positioning structure K and the protection cover structure P and fix the multichip package structure M between the protection cover structure P and heat-dissipating structure H. When each securing element F1 sequentially passes through the positioning post K2 of the positioning structure K, the positioning hole P3 of the protection cover structure P, and the first heat-dissipating element H1 and the second heat-dissipating element H2 of the heat-dissipating structure H, the multichip package structure M can be fixed between the protection cover structure P and heat-dissipating structure H, thus each securing element F1 does not need to pass through the multichip package structure M for preventing the multichip package structure M from being damaged by the securing element F1.

Figure 3C:
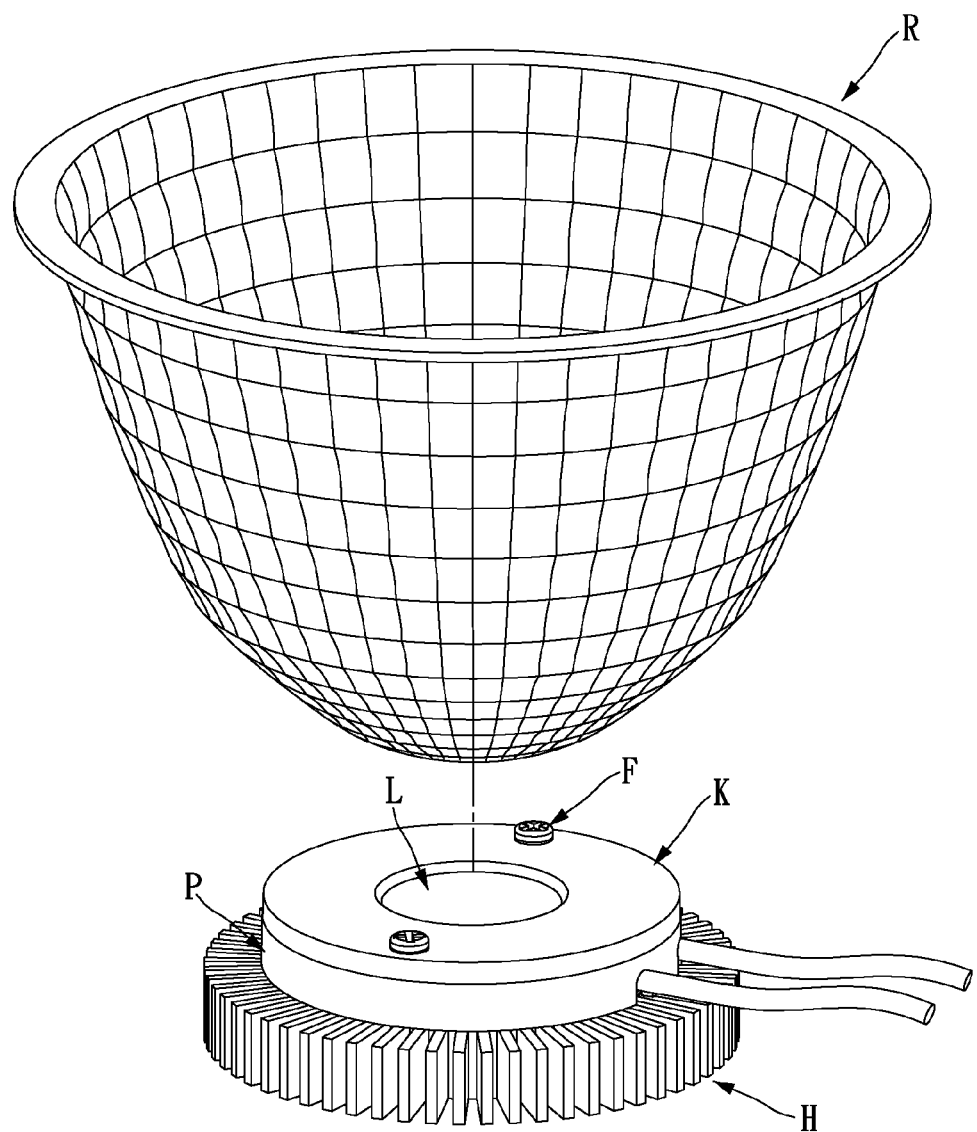
FIG. 3C shows a perspective, exploded, schematic view of the light-emitting module using the light-reflecting cover structure according to the third embodiment of the instant disclosure.
Figure 3D:
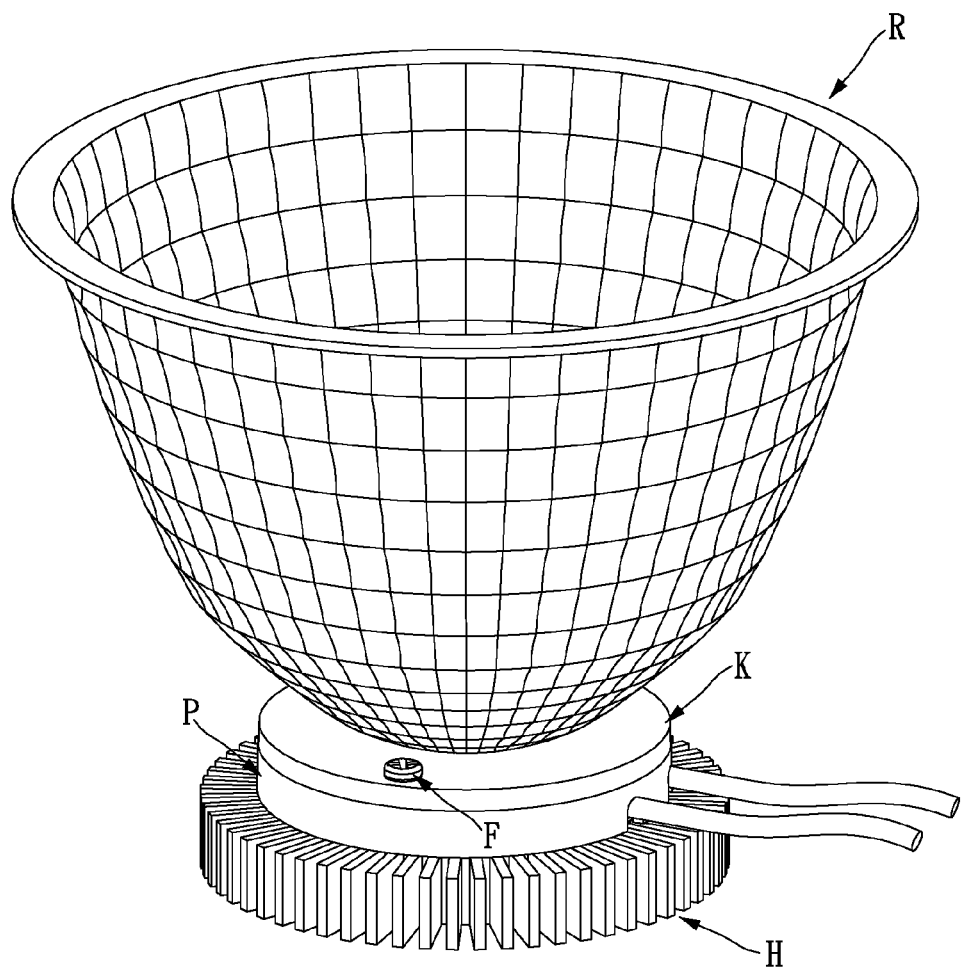
FIG. 3D shows a perspective, assembled, schematic view of the light-emitting module using the light-reflecting cover structure according to the third embodiment of the instant disclosure.

Furthermore, referring to FIG. 3C and FIG. 3D, the light-emitting module can further include a light-reflecting cover structure R as a condenser positioned on the positioning structure K to increase the light-emitting efficiency.

In conclusion, the protection cover structure having the opening is disposed on the heat-dissipating structure to cover and protect the multichip package structure, thus the light-emitting module is capable of the protection function.

The above-mentioned descriptions merely represent the preferred embodiments of the instant disclosure, without any intention or ability to limit the scope of the instant disclosure which is fully described only within the following claims Various equivalent changes, alterations or modifications based on the claims of instant disclosure are all, consequently, viewed as being embraced by the scope of the instant disclosure.

What is claimed is:

1. A light-emitting module, comprising:
a heat-dissipating structure;
a multichip package structure disposed on the heat-dissipating structure,
wherein the multichip package structure comprises:
a substrate unit including a substrate body and a chip-placing region formed on the top surface of the substrate body;
a light-emitting unit including a plurality of LED bare chips disposed on the chip-placing region and electrically connected to the substrate body;
a frame unit including a surrounding light-reflecting colloid body surroundingly coated on the top surface of the substrate body, wherein the surrounding light-reflecting colloid body surrounds the LED bare chips to form a colloid position limiting space on the chip-placing region; and
a package unit including a light-transmitting colloid body disposed on the top surface of the substrate body and in the colloid position limiting space to cover the LED bare chips; and
a protection cover structure disposed on the heat-dissipating structure to cover and protect the multichip package structure, wherein the protection cover structure has an opening for exposing the package unit.

2. The light-emitting module of claim 1, wherein the surrounding light-reflecting colloid body has a convex or concave junction portion formed on the top surface thereof.

3. The light-emitting module of claim 1, wherein the protection cover structure has a bottom side contacting the substrate unit of the multichip package structure.

4. The light-emitting module of claim 1, wherein the protection cover structure has a surrounding inclined surface formed in opening.

5. The light-emitting module of claim 1, further comprising: a lens structure disposed on the protection cover structure to cover the opening of the protection cover structure.

6. The light-emitting module of claim 5, further comprising: a securing structure including a plurality of securing elements, wherein each securing element sequentially passes through the lens structure, the protection cover structure and one part of the heat-dissipating structure to fix the substrate unit of the multichip package structure between the protection cover structure and the heat-dissipating structure.

7. A light-emitting module, comprising:
a heat-dissipating structure;
a multichip package structure disposed on the heat-dissipating structure,
wherein the multichip package structure comprises:
a substrate unit including a substrate body, a first chip-placing region formed on the top surface of the substrate body, and a second chip-placing region formed on the top surface of the substrate body;
a light-emitting unit including at least one first light-emitting module and at least one second light-emitting module, wherein the at least one first light-emitting module includes a plurality of first LED bare chips disposed on the first chip-placing region and electrically connected to the substrate body, and the at least one second light-emitting module includes a plurality of second LED bare chips disposed on the second chip-placing region and electrically connected to the substrate body;
a frame unit including at least one first surrounding light-reflecting colloid body and at least one second surrounding light-reflecting colloid body surroundingly coated on the top surface of the substrate body, wherein the at least one first surrounding light-reflecting colloid body surrounds the at least one first light-emitting module to form at least one first colloid position limiting space on the first chip-placing region, and the at least one second surrounding light-reflecting colloid body surrounds the at least one second light-emitting module and the at least one first surrounding light-reflecting colloid body to form at least one second colloid position limiting space on the second chip-placing region and between the at least one first surrounding light-reflecting colloid body and the at least one second surrounding light-reflecting colloid body; and
a package unit including a first light-transmitting colloid body and a second light-transmitting colloid body disposed on the top surface of the substrate body to respectively cover the at least one first light-emitting module and the at least one second light-emitting module, wherein the first light-transmitting colloid body and the second light-transmitting colloid body are respectively disposed in the at least one first colloid position limiting space and the at least one second colloid position limiting space; and
a protection cover structure disposed on the heat-dissipating structure to cover and protect the multichip package structure, wherein the protection cover structure has an opening for exposing the package unit.

8. The light-emitting module of claim 7, wherein each first LED bare chip is a red LED bare chip, each second LED bare chip is a blue LED bare chip, the first light-transmitting colloid body is a transparent colloid body, and the second light-transmitting colloid body is a phosphor colloid body.

9. The light-emitting module of claim 7, wherein the surrounding light-reflecting colloid body has a convex or concave junction portion formed on the top surface thereof.

10. The light-emitting module of claim 7, wherein the at least one first surrounding light-reflecting colloid body and the at least one second surrounding light-reflecting colloid body are arranged as concentric circles, the at least one second light-emitting module is disposed between the at least one first surrounding light-reflecting colloid body and the at least one second surrounding light-reflecting colloid body, and the at least one second light-emitting module surrounds the at least one first surrounding light-reflecting colloid body.

11. The light-emitting module of claim 7, further comprising: a current-limiting unit including at least two current-limiting chips disposed on the top surface of the substrate body and electrically connected to the substrate body and separated from the at least one first surrounding light-reflecting colloid body by a predetermined distance, wherein the frame unit includes at least two third surrounding light-reflecting colloid bodies surroundingly coated on the top surface of the substrate body to respectively surround the at least two current-limiting chips, and the package unit includes at least two opaque colloid bodies disposed on the top surface of the substrate body to respectively cover the at least two current-limiting chips and be respectively surrounded by the at least two third surrounding light-reflecting colloid bodies, wherein the at least one first light-emitting module and the at least one second light-emitting module are electrically connected to the substrate body in parallel, the first LED bare chips and one of the two current-limiting chips are electrically connected with each other in series, and the second LED bare chips and the other current-limiting chip are electrically connected with each other in series.

12. The light-emitting module of claim 11, wherein the substrate unit includes at least one heat-insulating slot passing through the substrate body, and the at least one heat-insulating slot is formed between the light-emitting unit and the current-limiting unit.

13. The light-emitting module of claim 7, wherein the protection cover structure has a bottom side contacting the substrate unit of the multichip package structure.

14. The light-emitting module of claim 7, wherein the protection cover structure has a surrounding inclined surface formed in opening.

15. The light-emitting module of claim 7, further comprising: a lens structure disposed on the protection cover structure to cover the opening of the protection cover structure.

16. The light-emitting module of claim 15, further comprising: a securing structure including a plurality of securing elements, wherein each securing element sequentially passes through the lens structure, the protection cover structure and one part of the heat-dissipating structure to fix the substrate unit of the multichip package structure between the protection cover structure and the heat-dissipating structure.

* * * * *